United States Patent [19]

Mihara

[11] Patent Number: 4,686,551

[45] Date of Patent: Aug. 11, 1987

[54] MOS TRANSISTOR

[75] Inventor: Teruyoshi Mihara, Yokosuka, Japan

[73] Assignee: Nissan Motor Co., Ltd., Yokohama, Japan

[21] Appl. No.: 865,598

[22] Filed: May 22, 1986

Related U.S. Application Data

[63] Continuation of Ser. No. 555,050, Nov. 25, 1983, abandoned.

[30] Foreign Application Priority Data

Nov. 27, 1982 [JP] Japan ................. 57-208293

[51] Int. Cl.$^4$ .............. H01L 29/78; H01L 29/90
[52] U.S. Cl. ................... 357/23.4; 357/23.13; 357/13; 357/89
[58] Field of Search ............ 357/23.4, 23.13, 13, 357/89

[56] References Cited

U.S. PATENT DOCUMENTS

| | | | |
|---|---|---|---|
| 3,600,647 | 8/1971 | Gray | 357/23.8 |
| 3,756,876 | 9/1973 | Brown et al. | 357/23.1 |
| 3,923,553 | 12/1975 | Hayashi et al. | 357/41 |
| 3,999,210 | 12/1976 | Yamada | 357/65 |
| 4,005,470 | 1/1977 | Tucci et al. | 357/40 |
| 4,011,576 | 3/1977 | Uchida et al. | 357/54 |
| 4,345,265 | 8/1982 | Blanchard | 357/41 |
| 4,366,495 | 12/1982 | Goodman et al. | 357/22 |
| 4,370,798 | 2/1983 | Lien et al. | 29/576 B |
| 4,374,389 | 2/1983 | Temple | 357/13 |
| 4,384,301 | 5/1983 | Tasch, Jr. et al. | 357/23 |
| 4,394,674 | 7/1983 | Sakuma et al. | 357/20 |
| 4,503,448 | 3/1985 | Miyasaka | 357/23.13 |

FOREIGN PATENT DOCUMENTS

| | | |
|---|---|---|
| 0067475 | 12/1982 | European Pat. Off. |
| 1811492 | 8/1969 | Fed. Rep. of Germany |
| 2816271 | 11/1978 | Fed. Rep. of Germany |
| 51-85381 | 7/1976 | Japan ............ 357/23 VD |
| 57-88772 | 2/1982 | Japan |
| 57-42164 | 3/1982 | Japan |
| 57-103356 | 6/1982 | Japan |
| 58-16569 | 1/1983 | Japan |
| 58-175872 | 10/1983 | Japan |
| 58-210677 | 12/1983 | Japan |
| 2011178 | 7/1979 | United Kingdom |
| 2062349 | 5/1981 | United Kingdom |
| 2082385 | 3/1982 | United Kingdom |

OTHER PUBLICATIONS

Cady, R. C. et al., "Integration Technique for Closed Field-Effect Transistors", IBM Technical Disclosure Bulletin, vol. 16, No. 11, Apr. 1974.

Tihanyi, J., "A Qualitative Study of the DC Performance of SIPMOS Transistors", Siemens Forsch-u. Entwickl-Ber Bd 9 (1980) Nr. 4 c. Springer-Verlag 1980.

Bell, G. et al., "SIPMOS Technology, An Example of VSLI Precision ...", Siemens Forsch-u. Entwickl Ber Bd 9 (1980) Nr. 4 c. Springer-Verlag 1980.

HEXFET Databook, Chap. 5 "The HEXFETS Integral Reverse Rectifier", International Rectifier, El Segundo, California c. 1981.

Severns, "MOS FETs Rise to New Levels of Power", Electronics International, vol. 53, No. 12, May, 1980, pp. 143-152.

Sun et al, "Modeling of the On-Resistance of LDMOS, VDMOS, and VMOS Power Transistors", IEEE Trans. on Electron Dev., vol. ED-27, Feb. 1980, pp. 356-367.

Tarng, "On-Resistance Characterization of VDMOS Power Transistors", IEDM 1981, 17.7, pp. 429-433.

I. Yoshida et al, "A High Power ... Structure", IEEE Journal of Solid State Circuits, vol. Sc-11, No. 4, Aug. 1976.

Primary Examiner—Martin H. Edlow
Assistant Examiner—Robert Limanek
Attorney, Agent, or Firm—Schwartz, Jeffery, Schwaab, Mack, Blumenthal & Evans

[57] ABSTRACT

A MOS transistor having a capability for withstanding a higher surge voltage. The transistor comprises a high specific resistance region, a low specific resistance region located on the high specific resistance region and a well region located side by side with the high specific resistance region. The bottom surface of the well region comes in contact with the low resistance region, thereby breakdown current flows uniformly over a wide area.

17 Claims, 5 Drawing Figures

MOS TRANSISTOR

This application is a continuation, of application Ser. No. 555,050, filed Nov. 25, 1983, now abandoned.

BACKGROUND OF THE INVENTION

The present invention relates to a MOS transistor, and more particularly to a MOS transistor with improved means for preventing destruction due to breakdown.

In recent years, the development of a MOS power transistor allows a MOS transistor 1 as shown FIG. 1 to be used as a switching element for switching a power load 2. For example, in a vehicle, it has been proposed that the MOS transistor be applied to the switching of a power load assembled in various vehicles.

A MOS transistor having a structure as shown in FIG. 2 is well known as a prior art MOS transistor. The MOS transistor shown in FIG. 2 is a so-called vertical MOS transistor, for example, which is disclosed in U.S. Pat. No. 4,345,265. Basically, such a MOS transistor comprises a semiconductor substrate 6 including an N+ type region 4 having low specific resistance and to which a drain electrode 3 is joined at a lower surface of the N+ type region 4 and an N type region 5 having high specific resistance and joined to an upper surface side of the N+ type region 4, a plurality of P type well regions 7 having a conductive type opposite that of the substrate 6 and formed at predetermined intervals in the N type region 5 which is located on the upper portion of the substrate 6, N+ type source regions 8 formed in the P type well regions 7, and gate electrodes 10 formed through gate oxide layers 9 of insulating layers formed on the surface of the substrate 6 and the well regions 7 while extending over the N+ type source regions 8 and the N type region 5 of the substrate 6 which is substantially adapted to operate as a drain region. The top surface portion is covered with PSG (phospho-silicate glass) layer 12 except a portion from which a gate electrode 10 is taken out. A source electrode 11 is also joined to P+ type contact regions 13 formed in the P type well regions 7.

Such a MOS transistor is required to have a capability for withstanding a higher voltage due to the necessity of switching a relatively high voltage and high current. Specifically, when the load contains an inductive load such as a motor, a solenoid or the like, the MOS transistor is required to have a sufficient capability for withstanding a high surge voltage so that the MOS transistor is not destroyed by the surge voltage, since the high surge voltage occurs when a load current is cut off.

As is well known, the MOS transistor includes a parasitic zener diode between the source S and the drain D according to its construction. In FIG. 1, a zener diode Z represents the parasitic zener diode. In FIG. 2, the parasitic zener diode is composed of a PN junction formed between the P type well region 7 and the N type drain region 5.

When a voltage (which is a reverse voltage for the PN junction) is applied between the drain and the source, a depletion layer is produced around the junction between the drain region 5 and the well region 7. In FIG. 2, the region of the depletion layer appears between dotted lines 14a and indicated by reference numeral 14. The depletion layer 14 widens as the voltage between the drain and the source increases.

In the prior art MOS transistor shown in FIG. 2, it must be noted that an avalanche breakdown occurs in the junction between the N type drain region 5 and the well region 7 before the depletion layer 14 extending in the N type drain region 5 reaches the N+ drain region 4 and the current caused by the avalanche breakdown tends to concentrate locally. Accordingly, when the avalanche breakdown is produced by the surge voltage or the like, since the current concentrates locally even if the breakdown current flowing between the drain and the source is relatively small, the MOS transistor element would be destroyued by heating due to the current causes.

As will be described in detail about this phenomenon, the depletion layer 14 in the N type drain region 5 contains valleys V between the two adjacent well regions 7 when the extension of the depletion layer 14 is of a small width as shown by the dotted lines in FIG. 2. The electric field applied to the depletion layer 14 tends to concentrate on portions between the valleys V of the depletion layer 14 and the corners of the well regions 7 as shown by arrows E. In this manner, when the electric field applied to the depletion layer 14 concentrates locally, the flow of the current caused by the avalanche breakdown concentrates on the above mentioned portions, so that the MOS transistor element is destroyed due to the heating generated by the concentration of the current.

On the other hand, when a reverse voltage $V_R$ is applied across the PN junction, the extending width W of the depletion layer from the junction is known to be represented by:

$$W = \sqrt{\frac{2\epsilon\epsilon_0 |V_R|}{q \cdot Ni}} \quad (1)$$

where $\epsilon$ is a specific dielectric constant of the semiconductor, $\epsilon_o$ is the dielectric constant in the vacuum, q is the charge of the electron, and Ni is an impurity concentration of P type or N type semiconductor.

Further, a withstanding voltage of the PN junction is determined by a higher specific resistance (lower impurity concentration) in either P region or N region as well known. Suppose that the lower impurity concentration is Ni, it is known that the voltage BV at which the avalanche breakdown occurs between the PN junction is approximately in inverse proportion to the impurity concentration Ni.

In the prior art vertical MOS transistor shown in FIG. 2, the impurity concentration in the P type well region 7 is higher than the impurity concentration in the N type drain region 5 and the withstanding voltage of the PN junction (the voltage at which the avalanche breakdown occurs) is determined by the impurity concentration in the N type drain region 5. For example, the impurity concentration in the surface of the P type well region 7 is $10^{18}/cm^3$ and the impurity concentration in the N type drain region 5 is approximately $10^{14}-10^{15}/cm^3$. Accordingly, when the depletion layer extends in the N type drain region 5, the avalanche breakdown of the PN junction occurs at the withstanding voltage corresponding to the concentration in the N type drain region.

SUMMARY OF THE INVENTION

In view of the above drawbacks in the prior art, it is an object of the present invention to provide a vertical MOS transistor in which even if a breakdown is caused by a surge voltage or the like, the breakdown current flows uniformly over relatively broad portions without concentration of the current so that the destruction of the MOS transistor element by heating is prevented, that is, a capability for withstanding the surge voltage is large.

These and other objects, features and advantages are accomplished by a provision of a vertical MOS transistor having a semiconductor substrate which includes a high specific resistance region adjacent to a well region and a low specific resistance region coming in contact with the bottom of the well region.

BRIEF DESCRIPTION OF THE DRAWINGS

These and other objects, features and advantages of the present invention will be more clearly understood in the following detailed description taken in conjuction with the accompanying drawings, in which.

DETAILED DESCRIPTION OF PREFERRED EMBODIMENTS

Figure 1:
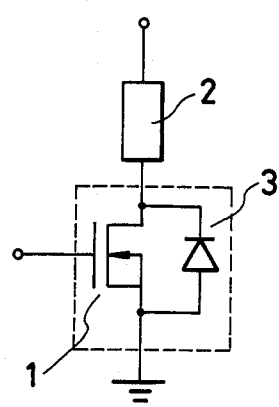
FIG. 1 is a switching circuit diagram using a MOS transistor.
Figure 2:
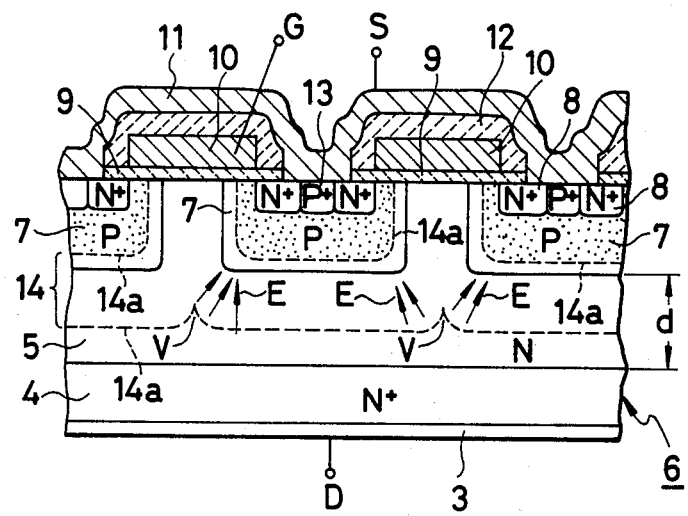
FIG. 2 is a cross-sectional view of a prior art MOS transistor.
Figure 3:
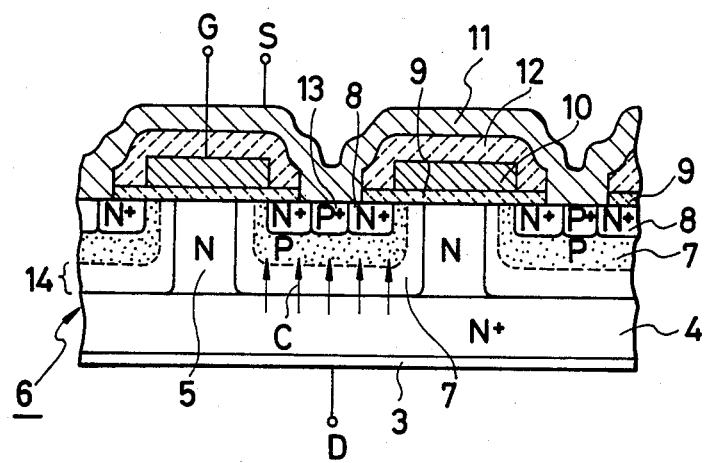
FIG. 3 is a cross-sectional view of a MOS transistor according to one embodiment of the present invention.

Referring to FIG. 3 in which one embodiment of the present invention is shown, the basic construction of the MOS transistor shown in FIG. 3 is the same as that in the prior art shown in FIG. 2. Thus, like reference numerals are associated with like parts.

The MOS transistor comprises a semiconductor substrate 6 including an N+ type region 4 having low specific resistance and to which a drain electrode 3 is joined at a lower surface of the N+ type region 4 and an N type region 5 having high specific resistance and joined to an upper surface side of the N+ type region 4, a plurality of P type well regions 7 having a conductive type opposite that of the substrate 6 and located on the upper portion of the substrate 6 at predetermined intervals, N+ type source regions 8 formed in the P type well regions 7, and gate electrodes 10 formed through gate oxide layers 9 of insulating layers formed on the surface of the substrate 6 and the well regions 7 while extending over the N+ type source regions 8 and the N type region 5 of the substrate 6 which is substantially adapted to operate as a drain region. The top surface portion is covered with PSG (phospho-silicate glass) layer 12 except a portion from which a gate electrode 10 is taken out. A source electrode 11 is also joined to P+ type contact regions 13 formed in the P type well regions 7.

The MOS transistor according to the present invention in FIG. 3 is characterized in that the bottom of the P type well regions 7 comes in contact with the N+ type region 4 having low specific resistance in the substrate 6. Namely the P type well region 7 and the N type drain region 5 are located side by side with each other on the flat upper surface of the N+ type drain region 4. The zener diode parasitized between the drain and the source is thus constructed by the PN+ junction between the P type well region 7 and the N+ drain region having low specific resistance in the substrate 6.

Explaining an example by using practical values, the semiconductor substrate 6 is composed of the N+ type drain region 4 having low specific resistance of 0.01 $\Omega$cm and the same N type drain region 5 having high specific resistance of 2.5 $\mu$cm and width of 5 $\mu$m. The P type well region 7 forming a channel is also formed in the drain region 5 having high specific resistance with the impurity concentration of approximately $10^{18}/cm^3$ at its surface.

Specifically, the important thing hereupon is that the P type well region 7 is formed to reach the N+ drain region 4 having low specific resistance in the substrate 6. In other words, the bottom of the well region 7 comes in contact with the drain region 4 having low specific resistance.

The junction between the P type region 7 and the N+ type region 4 is planar and has wide area extending over the almost all bottom area of the well region 7.

Therefore, in the MOS transistor according to the present invention, the withstanding voltage of the parasitic zener diode between the drain and the source is determined by the impurity concentration (or specific resistance) of the P type well region 7 and the breakdown current can flow uniformly as compared with the prior art MOS transistor shown in FIG. 2 in which the breakdown current concentrates in the vicinity of the corner portion of the well region 7. In addition, the operation and the effect according to the present invention are as follows.

In the MOS transistor of the embodiment, since the bottom of the P type well region 7 comes in contact with the N+ type drain region 4 having low specific resistance and the junction between both is a plane of wide area, the distribution of the electric field produced in the depletion layer is substantially uniform over all area of the junction as shown by arrows C in FIG. 3. Therefore, even if the avalanche breakdown occurs in the PN+ junction, the breakdown current flows uniformly over all area of the PN+ junction and thus the concentration of the current as in the prior art does not occur. Accordingly, if a considerably large breakdown current flows between the drain and source electrode, the current flows uniformly within the MOS transistor element and thus it is prevented that the element is destroyed by heating due to the concentration of the current as in the prior art, thereby the sufficient capability for withstanding a higher surge voltage can be obtained.

Further, in the MOS transistor of the embodiment, the withstanding voltage of the PN+ junction can be set up to a desired voltage by properly controlling the distribution of the impurity concentration in the P type well region 7. Practically, a desired withstanding voltage can be realized by controlling the impurity concentration in the surface or the diffusion time when the well region 7 is formed by diffusion.

Figure 4:
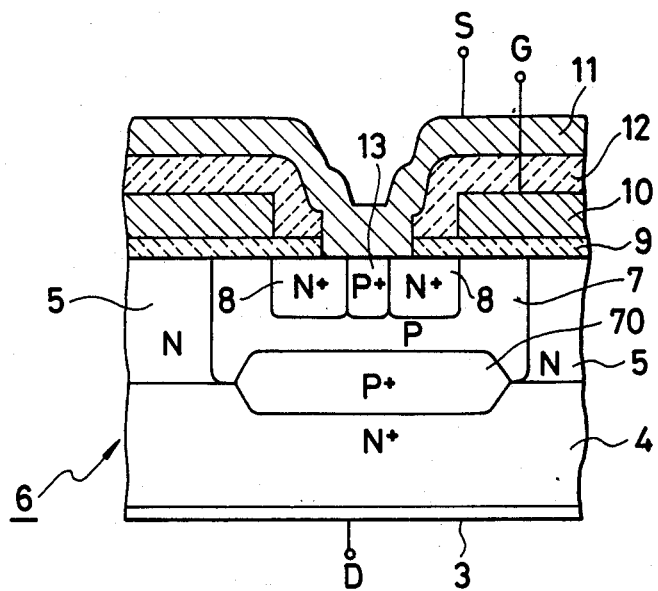
FIG. 4 is a cross-sectional view of a MOS transistor according to a second embodiment of the present invention.

FIG. 4 shows a second embodiment of the present invention. This embodiment is characterized in that a heavily doped p+ type buried layer 70 is disposed on the bottom of the P type well region 7 and the P type well region 7 is opposite to the N+ drain region 4 through the buried layer 70.

In this case, since the parasitic zener diode between the drain and the source is formed by the P+N+ junction between the buried layer 70 and the drain region 4, a uniform avalanche breakdown easily occurs over the entire area of the junction. Further, the corner portion of the buried layer 70 which forms the heavily doped P+N+ junction has almost no effect, while the concentration of the electric field at a curved portion of the PN junction is disadvantageous in the lightly doped PN junction. Since the MOS transistor in this embodiment has a lower withstanding voltage of the P+N+ junction, it is especially suitable for a MOS transistor for switching an inductive load applied with a low voltage.

Figure 5:
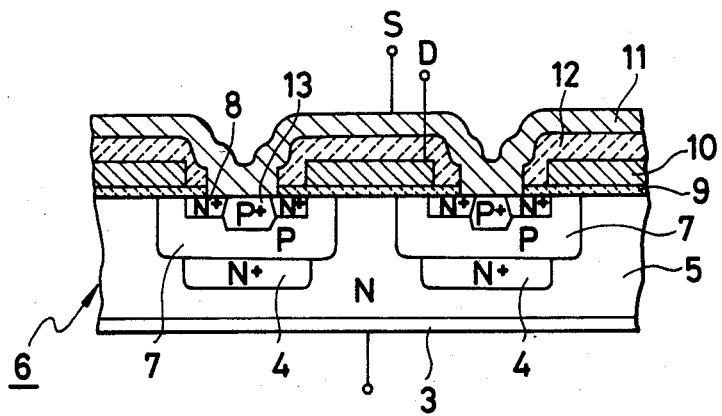
FIG. 5 is a cross-sectional view of a MOS transistor according to a third embodiment of the present invention.

FIG. 5 shows a third embodiment of the present invention. The embodiment is characterized in that the N+ drain region 4 having low specific resistance and coming in contact with the bottom of the P type well region 7 is not formed over the entire area at a lower side of the substrate 6 and is buried by means of, for example, a known diffusion method just under the bottom of the P type well region 7. In this embodiment, the parasitic zener diode is formed by the PN+ junction between the P type well region 7 and the N+ type drain region 4 having low specific resistance and there are the same operation and effect as the above first embodiment.

Explanation of the prior art and the embodiments of the present invention has been made to the N-channel MOS transistor. However, the present invention is also applicable to the P-channel MOS transistor in the same manner.

Further, the present invention is applicable not only to the vertical MOS transistor having the shown constructions but also to, for example, the similar vertical VMOS transistor in the same manner as above.

What is claimed is;

1. A vertical MOS transistor comprising:
    a low specific resistance drain region of a first conductivity type provided with a drain electrode on a lower surface thereof,
    a high specific resistance drain region of said first conductivity type located on an upper surface of said low specific resistance drain region,
    a diffused well region of a second conductivity type having a lower surface in contact with said upper surface of said low resistivity drain region to form a junction, said well region having a lower impurity concentration than said low resistivity drain region;
    a source region of said first conductivity type partially surrounded by said well region and provided with a source electrode,
    means for directly electrically connecting said well region to the source electrode; and
    a gate electrode formed above the surface of said well region on an insulating layer;
    so that a wide zener diode is formed along said junction between said lower surface of said well region and said upper surface of said low specific resistance drain region and a breakdown voltage applied across said source and drain electrode causes a uniform flow of breakdown current across said junction.

2. A vertical MOS transistor according to claim 1, wherein said well region includes lateral surfaces in contact with said high specific resistance drain region.

3. A vertical MOS transistor according to claim 1, comprising a plurality of similar cells, each of said cells comprising said low specific resistance drain region, said high specific resistance drain region, said well region, said source region, and said gate region so that said wide zener diode is formed in each cell, said cells being connected in parallel.

4. A vertical MOS transistor according to claim 1, wherein said gate electrode extends over both said source regions and said high specific resistance drain region.

5. A vertical MOS transistor according to claim 1, wherein said upper surface of said low specific resistance drain region is flat and said lower surface of said well region is flat.

6. A vertical MOS transistor according to claim 1, wherein said means comprises a low specific resistance contact region formed in said well region.

7. A vertical MOS transistor according to claim 3, wherein said well regions are formed by diffusion.

8. A vertical MOS transistor according to claim 7, wherein said well regions have a specific resistance between said high specific resistance drain regions and said low specific resistance drain regions.

9. A vertical MOS transistor according to claim 2, wherein said lateral surfaces include convexly curved portions.

10. A device, comprising:
    a drain region having a low resistivity region of a first conductivity type and a high resistivity region of the first conductivity type above said low resistivity region;
    a diffused well region of a second conductivity type having a lower surface in contact with said low resistivity region and lateral surfaces in contact with said high resistivity region;
    a channel region of the second conductivity type contained in said well region;
    a source region of the first conductivity type adjacent said channel region and partially surrounded by said well region;
    a gate electrode formed above the channel region through an insulator layer;
    a source electrode in contact with the source region;
    means for making direct electrical contact between said source electrode and said well region; and
    a drain electrode formed on the bottom surface of the low resistivity region.

11. A device as set forth in claim 10, wherein said well region has a resistivity between that of said high resistivity region and that of said low resistivity region.

12. A device as set forth in claim 11, wherein said means comprises a low resistivity region formed in said well region.

13. A device as set forth in claim 12, wherein said lateral surfaces include convexly curved portions.

14. A vertical MOS transistor comprising:
    a low specific resistance region of a first conductivity type provided with a drain electrode on a lower flat surface thereof,
    a high specific resistance region of said first conductivity type located on a first portion of an upper surface of said low specific resistance region,
    a well region of a second conductivity type opposite said first conductivity type located side by side with said high specific resistance region,
    a source region of said first conductivity type formed in said well region and provided with a source electrode,
    a gate electrode formed on an upper surface of said well region through an insulating layer and extending over both of said source region and said high specific resistance region, and means for forming a wide channel zener diode between the source electrode and the drain electrode, said means including a buried region of said second conductivity type having an impurity concentration higher than that of said well region and disposed between a bottom surface of said well region and a second portion of said upper surface of said low specific resistance region, said diode being formed along a lower surface of said buried region adjoining said second portion of said upper surface of said low specific resistance region.

15. A vertical MOS transistor claimed in claim 6, wherein, said first conductivity type is an N type conductivity.

16. A vertical MOS transistor as claimed in claim 14, wherein said high specific resistance region, said well region, said source region, and said buried region are diffused regions.

17. A vertical MOS transistor comprising:

a semiconductor substrate of a first conductivity type provided with a drain electrode on a lower surface thereof,
a well region of a second conductivity type opposite said first conductivity type formed in an upper portion of said substrate,
a source region of said first conductivity type having a source electrode and being formed in said well region, and
a gate electrode formed on the surface of said well region through an insulating layer,
means for forming a wide channel zener diode between said source electrode and said drain electrode, said means including a low specific resistance region of said first conductivity type disposed between a bottom surface of said well region and said substrate, said diode being formed along an elongated substantially planar interface of said low spacific resistance region and substrate.

\* \* \* \* \*